US008895399B2

(12) United States Patent
Bowman (10) Patent No.: US 8,895,399 B2
(45) Date of Patent: Nov. 25, 2014

(54) INTEGRATED CIRCUIT AND METHOD OF FORMING SEALED TRENCH JUNCTION TERMINATION

(75) Inventor: Ronald R. Bowman, Chandler, AZ (US)

(73) Assignee: Addison R. Crockett, Tempe, AZ (US)

( * ) Notice: Subject to any disclaimer, the term of this patent is extended or adjusted under 35 U.S.C. 154(b) by 0 days.

(21) Appl. No.: 13/568,410

(22) Filed: Aug. 7, 2012

(65) Prior Publication Data
US 2012/0299148 A1 Nov. 29, 2012

Related U.S. Application Data

(63) Continuation of application No. 12/182,699, filed on Jul. 30, 2008, now abandoned.

(51) Int. Cl.
| | |
|---|---|
| H01L 21/331 | (2006.01) |
| H01L 29/74 | (2006.01) |
| H01L 29/06 | (2006.01) |
| H01L 29/861 | (2006.01) |
| H01L 29/747 | (2006.01) |
| H01L 29/732 | (2006.01) |
| H01L 29/66 | (2006.01) |

(52) U.S. Cl.
CPC ............ *H01L 29/8613* (2013.01); *H01L 29/74* (2013.01); *H01L 29/0661* (2013.01); *H01L 29/861* (2013.01); *H01L 29/747* (2013.01); *H01L 29/7322* (2013.01); *H01L 29/7325* (2013.01); *H01L 29/66272* (2013.01)
USPC ......................................... 438/357; 438/356

(58) Field of Classification Search
USPC ........... 257/353, 356, 357; 438/353, 356, 357
See application file for complete search history.

(56) References Cited

U.S. PATENT DOCUMENTS

| | | | |
|---|---|---|---|
| 4,135,291 A | 1/1979 | Tursky et al. | |
| 4,202,916 A | 5/1980 | Chadda | |
| 4,371,423 A | 2/1983 | Yoshizawa et al. | |
| 5,021,355 A | 6/1991 | Dhong et al. | |
| 5,395,801 A | 3/1995 | Doan et al. | |
| 6,262,472 B1 | 7/2001 | Gregory | |
| 6,287,930 B1 | 9/2001 | Park | |
| 6,337,501 B1 * | 1/2002 | Fukuda et al. ................ 257/350 |

(Continued)

FOREIGN PATENT DOCUMENTS

| | | |
|---|---|---|
| CN | 1561546 A | 1/2005 |
| EP | 1215734 A2 | 6/2002 |
| JP | 54017682 | 2/1979 |
| JP | 56134765 | 10/1981 |

*Primary Examiner* — Bradley K Smith
(74) *Attorney, Agent, or Firm* — Robert D. Atkins; Patent Law Group: Atkins and Associates, P.C.

(57) ABSTRACT

An integrated circuit having a substrate with a first conductivity type of semiconductor material. A buried layer is formed in the substrate. The buried layer has a second conductivity type of semiconductor material. A first semiconductor layer is formed over the buried layer. The first semiconductor layer has the second conductivity type of semiconductor material. A trench is formed through the first semiconductor layer and buried layer and extends into the substrate. The trench is lined with an insulating layer and filled with an insulating material. A second semiconductor layer is formed in the first semiconductor layer. The second semiconductor layer has the first conductivity type of semiconductor material. A third semiconductor layer is formed in the second semiconductor layer. The third semiconductor layer has the second conductivity type of semiconductor material. The first, second, and third semiconductor layers form the collector, base, and emitter of a bipolar transistor.

13 Claims, 6 Drawing Sheets

(56) References Cited

U.S. PATENT DOCUMENTS

| | | | |
|---|---|---|---|
| 6,528,375 B2 * | 3/2003 | Gregory | 438/302 |
| 6,798,016 B2 | 9/2004 | Boden, Jr. | |
| 7,253,477 B2 * | 8/2007 | Loechelt et al. | 257/341 |
| 7,535,057 B2 | 5/2009 | Yang | |
| 7,767,529 B2 | 8/2010 | Venkatraman et al. | |
| 2001/0048134 A1 * | 12/2001 | Park | 257/347 |
| 2004/0056310 A1 | 3/2004 | Probst | |
| 2006/0040464 A1 | 2/2006 | Jung | |
| 2006/0267044 A1 * | 11/2006 | Yang | 257/141 |
| 2007/0086129 A1 | 4/2007 | Vos et al. | |

* cited by examiner

INTEGRATED CIRCUIT AND METHOD OF FORMING SEALED TRENCH JUNCTION TERMINATION

CLAIM OF DOMESTIC PRIORITY

The present application is a continuation of U.S. patent application Ser. No. 12/182,699, filed Jul. 30, 2008, which application is incorporated herein by reference.

CROSS-REFERENCE TO RELATED APPLICATIONS

The present application is related to co-pending U.S. application Ser. No. 13/427,543, entitled "DISCRETE SEMICONDUCTOR DEVICE AND METHOD OF FORMING SEALED TRENCH JUNCTION TERMINATION," filed on Mar. 22, 2012.

FIELD OF THE INVENTION

The present invention relates in general to semiconductor devices and, more particularly, to an integrated circuit having a sealed trench junction termination for providing improved electrical characteristics.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Active and passive devices can also be formed on the backside of the wafer. Back-end manufacturing refers to cutting or singulating the finished wafer into the individual die and then packaging the die for structural support and environmental isolation.

Semiconductor devices come in a variety of package types and perform specific functions. Some common types of semiconductor devices are integrated circuits (ICs) and discrete devices, such as transistors, diodes, rectifiers, transit voltage suppressors, silicon controlled rectifiers (SCR), and thyristors. Discrete semiconductor devices perform specific functions such as signal rectification and power transfer. For example, a thyristor is a solid state discrete semiconductor device with four layers of alternating n-type and p-type semiconductor material, i.e., p-n-p-n or n-p-n-p. The thyristor operates as a switch, conducting when the gate receives a current pulse, and continuing to conduct while forward biased. An IC contains hundreds or thousands of transistors and other semiconductor components necessary to perform more complex analog and digital functions.

Figure 1:
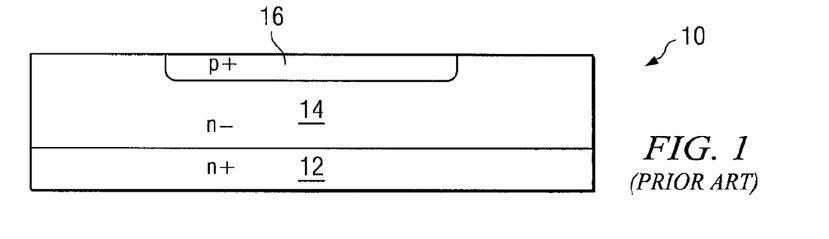
FIG. 1 illustrates a cross-sectional view of a conventional p-n junction diode formed by a planar process.

Many discrete semiconductor devices, such as diodes, SCRs, and thyristors, are manufactured by a planar process or mesa process. FIG. 1 illustrates a cross-sectional view of a conventional diode 10 containing a p-n junction, e.g., rectifier, small signal, or Zener. Diode 10 is made with a planar process. A n+ substrate 12 is shown with n− epitaxial (epi) layer 14 formed on substrate 12. Substrate 12 provides structural support to the device. A p+ region 16 is formed in epi layer 14. The planar process will have a surface silicon dioxide (SiO2) layer formed over the device. The p-n junction is formed between n− epi layer 14 and p+ region 16. Substrate 12, epi layer 14, and region 16 can be formed with opposite conductivity types, i.e., p+ substrate, p− epi layer, and n+ well.

Figure 2:
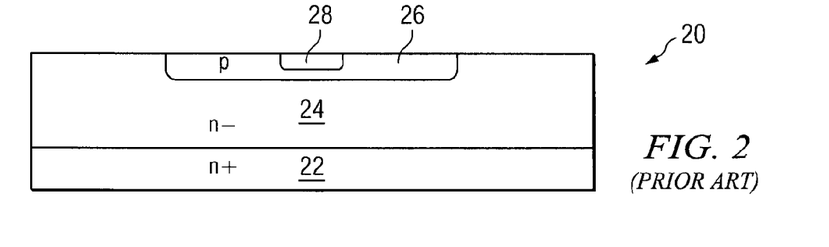
FIG. 2 is a conventional n-p-n transistor formed by a planar process.

FIG. 2 shows a conventional transistor 20 made with a planar process. An n+ substrate 22 is shown with n− epi layer 24 formed on substrate 22. Substrate 22 provides structural support to the device. A p well 26 is formed in epi layer 24. An n+ region 28 is formed in p well 26. The planar process will have a surface SiO2 layer formed over the device. The n-p-n transistor is formed between n− epi layer 24, p well 26, and n+ region 28. Substrate 22, epi layer 24, well 26, and region 28 can be formed with opposite conductivity types, i.e., p+ substrate, p− epi layer, n well, and p+ region.

Figure 3:
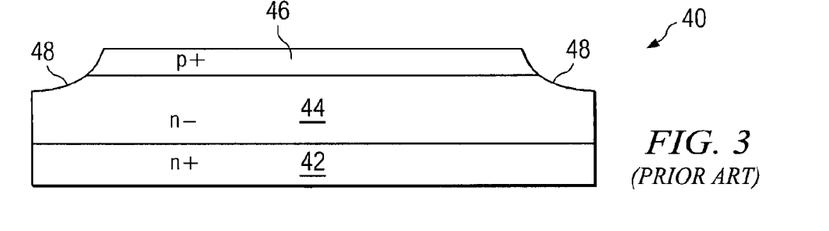
FIG. 3 is a conventional p-n junction diode formed by a mesa process.

FIG. 3 shows a conventional diode 40 containing a p-n junction made with a mesa process. An n+ substrate 42 is shown with n− epi layer 44 formed on substrate 42. Substrate 42 provides structural support to the device. A p+ layer 46 is formed over epi layer 44. Contours 48 are formed in epi layer 44 and layer 46 to build the mesa between the contours. The p-n junction is formed between n− epi layer 44 and p+ layer 46. Substrate 42, epi layer 44, and layer 46 can be formed with opposite conductivity types, i.e., p+ substrate, p− epi layer, and n+ layer.

Planar and mesa processes impose certain limitations on the manufacturing process and design criteria that can affect the electrical parameters of the device. An important consideration is the behavior of the p-n junction under high voltage. A high voltage creates electric field fringing because the junction terminates at the device surface. Accordingly, silicon p-n junctions normally breakdown at the surface of the device. The fringing electric field reduces the device breakdown voltage. To compensate, guard rings or field plates are often used to spread out the fringing electric field.

Depending on the specific manufacturing steps, the planar process can have surface state limitations that degrade the reverse breakdown voltage and increase the p-n junction leakage current. The surface state limitations further restrict the level of breakdown voltage that can be obtained even if other design parameters are proper. The planar process typically requires deep junctions to decrease the radius of curvature of the diffused junction. However, the deep junction has the undesired effect of increasing the sidewall capacitance of the p-n junction and adds to the manufacturing cost.

In a mesa manufacturing process, photolithography and etching are used to define the p-n junction. Again, an important consideration is the behavior of the p-n junction under high voltage. Contouring the shape of the mesa can improve the breakdown voltage as shown in FIG. 3, but adds complexity and cost to the manufacturing process. The removal of silicon to form the contours and mesa makes wafer handling problematic and leads to wafer breakage and yield loss.

The planar and mesa processes have used different types of passivation films to help maintain a stable reverse breakdown voltage. For example, a high temperature oxidation can be used to passivate the p-n junction, followed by additional thin passivation layers to obtain a stable junction. In adapting various passivation films, surface states and charges within the film must be closely monitored to prevent undesirable characteristics. The additional passivation layers require more handling that further leads to wafer breakage and contamination that can degrade the electrical parameters. The passivation films also add cost, complexity, and variation to the manufacturing process which can degrade the film characteristics, as well as the p-n junction. The potential for wafer breakage limits the use of large diameter wafers which increases manufacturing costs.

Another deficiency is the relatively poor electrical stability when the semiconductor device is subjected to high temperature reverse bias (HTRB) at elevated temperature, such as 150° C. to 175° C. While surface passivation films may provide satisfactory results at lower operating conditions, long term high temperature stability is preferred as a measure of stability for the semiconductor device, especially for military and space applications.

In the manufacture of ICs, an isolation diffusion process is commonly used to make analog and digital circuits. The isolation diffusion process uses photolithography and etching to define the isolation surface area. The resolution of the photolithographic process defines the width of the isolation pattern. The isolation diffusion process imposes certain design limitations that affect the electrical parameters and die size, including the width of the isolation pattern, thickness of the epi, and resistivity that must be scaled to the desired voltage. In general, the higher the voltage, the higher the resistivity and the thicker the epi layer. The isolation diffusion process can cause lateral junction-spreading from all edges of the defining mask pattern at the surface of the die which imposes a volume space problem at the junction. The spreading extends laterally as the diffusion is driven downward to the substrate, which requires a substantial amount of silicon to isolate each active device area.

Depending on the specific manufacturing steps, the isolation diffusion process can have surface state limitations that degrade the reverse breakdown voltage and increase the p-n junction leakage current. The surface state limitations further restrict the level of breakdown voltage that can be obtained even if other design parameters are proper. Accordingly, the high voltage process typically requires deep junctions to decrease the radius of curvature of the diffused junction. However, the deep junction has the undesired effect of increasing the sidewall capacitance of the p-n junction and adds to the manufacturing cost.

SUMMARY OF THE INVENTION

In one embodiment, the present invention is a method of making a semiconductor device comprising the steps of providing a substrate including semiconductor material of a first conductivity type, forming a buried semiconductor layer of a second conductivity type in the substrate, forming a first semiconductor layer of the second conductivity type over the buried semiconductor layer, forming a trench through the first semiconductor layer and buried semiconductor layer extending into the substrate, forming an insulating layer on a wall of the trench, and depositing an insulating material in the trench. The method further includes the step of forming a discrete device by doping the first semiconductor layer to form a second semiconductor layer of the first conductivity type, forming a third semiconductor layer of the second conductivity type in the second semiconductor layer, forming a first metal layer directly above and abutting the second semiconductor layer, and forming a second metal layer directly above and abutting the third semiconductor layer. The insulating material in the trench surrounds the discrete device.

In another embodiment, the present invention is a method of making an integrated circuit comprising the steps of providing a substrate including semiconductor material of a first conductivity type, forming a buried semiconductor layer of a second conductivity type in the substrate, forming a first semiconductor layer of the second conductivity type over the buried semiconductor layer, forming a trench through the first semiconductor layer and buried semiconductor layer extending into the substrate, and depositing an insulating material in the trench. The method further includes the step of forming a discrete device by forming a second semiconductor layer of the first conductivity type in the first semiconductor layer and forming a first metal layer above and abutting the second semiconductor layer. The insulating material in the trench surrounds the discrete device.

In another embodiment, the present invention is a method of making an integrated circuit comprising the steps of providing a substrate, forming a first semiconductor layer in the substrate, forming a second semiconductor layer over the first semiconductor layer, forming a trench through the first and second semiconductor layers extending into the substrate, depositing an insulating material in the trench, and forming a first metal layer over the second semiconductor layer.

In another embodiment, the present invention is a semiconductor device comprising a first semiconductor layer formed in a substrate. A second semiconductor layer is formed over the first semiconductor layer. A trench is formed through the first and second semiconductor layer extending into the substrate. An insulating material is disposed in the trench. A first metal layer is disposed above the second semiconductor layer.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Active and passive devices can also be formed on the backside of the wafer. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon (Si). The backside of the wafer may also contain active and passive devices. The active surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Semiconductor devices come in a variety of package types and perform specific functions. Some common types of semiconductor devices are integrated circuits (ICs) and discrete devices, such as transistors, diodes, rectifiers, transit voltage suppressors, silicon controlled rectifiers (SCR), and thyristors. Discrete semiconductor devices perform specific functions, such as signal rectification and power transfer.

Figure 4A:
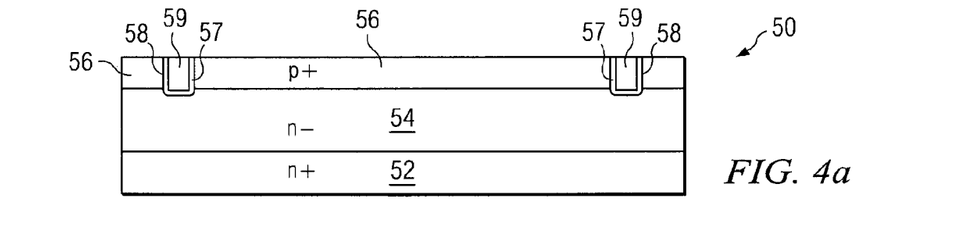
FIGS. 4a-4b illustrate cross-sectional and plan views of a p-n junction with a sealed trench junction termination.

FIG. 4a illustrates a cross-sectional view of one type of discrete semiconductor device, in this case a diode containing a p-n junction. Diode 50 is formed monolithically on n+ substrate 52. Substrate 52 provides structural support for the device. A plurality of doped semiconductor layers and regions are formed on substrate 52 using semiconductor photolithography or implantation manufacturing processes, such as layering, patterning, doping, and heat treatment. In the layering process, materials are grown or deposited on the substrate by techniques involving thermal oxidation, nitridation, chemical vapor deposition, evaporation, and sputtering. Patterning involves use of photolithography to mask areas of the surface and etch away undesired material to form specific structures. The doping process injects concentrations of dopant material, i.e., n-type semiconductor material or p-type semiconductor material, by thermal diffusion or ion implantation and thermal anneal.

To form diode 50, an n– epi layer 54 is formed on n+ substrate 52. The n-type semiconductor dopant can be phosphorus, arsenic, or antimony. A p+ layer 56 is formed over n– epi layer 54. The p-type semiconductor dopant can be boron, aluminum, or gallium. The p-n junction is defined by n– epi layer 54 and p+ layer 56, i.e., at the boundary where n-type semiconductor dopant charge is equal to and opposite of the p-type semiconductor dopant charge. Substrate 52, epi layer 54, and layer 56 can be formed with respectively opposite conductivity types, i.e., p+ substrate, p– epi layer, and n+ layer.

Figure 4B:
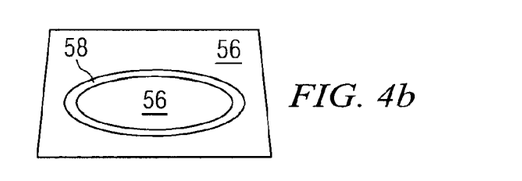

A trench 58 is formed through p+ layer 56 and extends into n– epi layer 54 using a photolithographic and anisotropic etching process. A photoresist layer is deposited to establish an area that surrounds the p-n junction of n– epi layer 54 and p+ layer 56. In the plan view of FIG. 4b, trench 58 is circular, oval, rounded, rectangular, hexagon, or other polygonal shape to surround the p-n junction. The unmasked areas are subjected to the anisotropic etch to form trench 58 to a predetermined depth. Trench 58 is made at least as deep as or deeper than the physical p-n junction between n– epi layer 54 and p+ layer 56 to provide a high voltage termination of the junction. In one embodiment, trench 58 has a depth of 14 micrometers (μm). The sidewalls of trench 58 are substantially vertical with respect to the surface of p+ layer 56. Alternatively, trench 58 can be formed by laser drilling or isotropic etching.

Trench 58 is lined or coated with a thermal oxide layer 57, such as silicon dioxide (SiO2), in an oxygen atmosphere at a temperature between 800° C. to 1150° C. The lining or coating 57 seals the perimeter of the p-n junction from contamination and provides long-term stability for diode 50. Trench 58 is filled with a dielectric or electrical insulating material 59 such as silicon nitride (Si3N4), silicon oxynitride (SiON), SiO2, tantalum pentoxide (Ta2O5), zirconium oxide (ZrO2), aluminum oxide (Al2O3), polysilicon, amorphous silicon, and semi-insulating polysilicon. The insulation-filled trench is planarized using etch-back or chemical mechanical polishing (CMP) to be even with the surface of p+ layer 56 in order to form one or more metallization layers which make ohmic electrical contact with the opposing regions of diode 50.

The vertical insulation-filled trench 57-59 defines the horizontal boundary of the p-n junction as a vertical plane extending at least down to or past the physical p-n junction. Any electric field imposed by a high voltage terminates at the horizontal boundary established by electrical insulating trench 57-59. Accordingly, trench 57-59 functions as a sealed trench junction termination, which provides a high breakdown voltage for the device. The electrical insulating trench 57-59 uses a small silicon area for the sealed trench junction termination, while providing mechanical strength for the wafer during subsequent handling in the manufacturing process.

By eliminating the p-n junction termination at the surface of the semiconductor body, as well as the junction curvature, diode 50 has significantly improved electrical characteristics. For example, surface effects on the leakage current of the p-n junction are substantially reduced. The reverse breakdown voltage is higher without increasing the size of the die and complexity of the manufacturing steps. Further, the reverse breakdown voltage of the p-n junction is more consistent across the wafer. The sidewall capacitance of the p– n junction is reduced which increases the frequency response of the device for high frequency applications. A semiconductor device having the electrical insulating trench offers improved reliability, wafer strength, die density per wafer, breakdown voltage, high temperature stability, less risk of breakage or contamination, and overall manufacturing yield.

Figure 5:
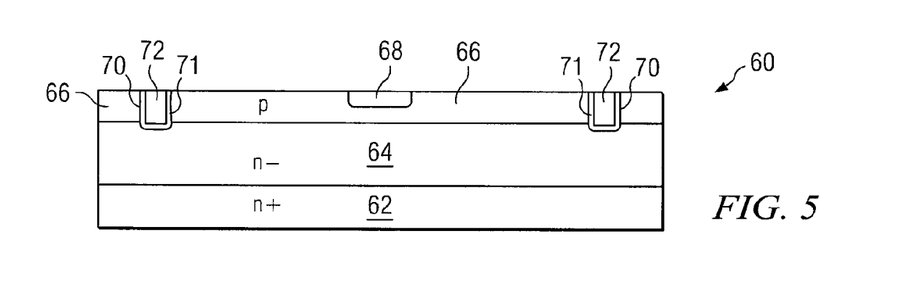
FIG. 5 is an n-p-n transistor with a sealed trench junction termination.

Another discrete semiconductor device is shown in FIG. 5, in this case an n-p-n trench transistor. Transistor 60 is formed monolithically on n+ substrate 62. Substrate 62 provides structural support for the device. A plurality of doped semiconductor layers and regions are formed on substrate 62 using semiconductor photolithography or implantation manufacturing processes such as layering, patterning, doping, and heat treatment. An n− epi layer 64 is formed on n+ substrate 62. The n-type semiconductor dopant can be phosphorus, arsenic, or antimony. A p layer 66 is formed over n− epi layer 64. The p-type semiconductor dopant can be boron, aluminum, or gallium. An n+ region 68 is formed in p layer 66. The n-p-n transistor is defined by n− epi layer 64, p layer 66, and n+ region 68. Substrate 62, epi layer 64, layer 66, and region 68 can be formed with respectively opposite conductivity types, i.e., p+ substrate, p− epi layer, and n layer, and p+ region.

A trench 70 is formed through p+ layer 66 and extends into n− epi layer 64 using a photolithographic and anisotropic etching process. A photoresist layer is deposited to establish an area for trench 70. In plan view, trench 70 is circular, oval, rounded, rectangular, hexagon, or other polygonal shape to surround the p-n junction. The unmasked areas are subjected to the anisotropic etch to form trench 70 to a predetermined depth. Trench 70 is made at least as deep as or deeper than the physical p-n junctions between n− epi layer 64 and p layer 66, and between p layer 66 and n+ region 68, to provide a high voltage termination of the junctions. The sidewalls of trench 70 are substantially vertical. Alternatively, trench 70 can be formed by laser drilling or isotropic etching.

Trench 70 is lined or coated with a thermal oxide layer 71, such as SiO2, in an oxygen atmosphere at a temperature between 800° C. to 1150° C. The lining or coating 71 seals the perimeter of the n-p-n transistor 60 from contamination and provides long-term stability. Trench 70 is filled with a dielectric or electrical insulating material 72, such as Si3N4, SiON, SiO2, Ta2O5, ZrO2, Al2O3, polysilicon, amorphous silicon, and semi-insulating polysilicon. The insulation-filled trench 70-72 is planarized using etch-back or CMP to be even with the surface of p layer 66 in order to form metallization layers which make ohmic electrical contact with the opposing regions of transistor 60.

The vertical insulation-filled trench defines the horizontal boundary of the n-p-n transistor as a vertical plane extending at least down to or past the physical p-n junction. Any electric field imposed by a high voltage terminates at the horizontal boundary established by electrical insulating trench 70. Accordingly, trench 70 functions as a sealed trench junction termination, which provides a high breakdown voltage for the device. The electrical insulating trench 70 uses a small silicon area for the sealed trench junction termination, while providing mechanical strength for the wafer during subsequent handling in the manufacturing process which provides a high breakdown voltage for the device.

Figure 6:
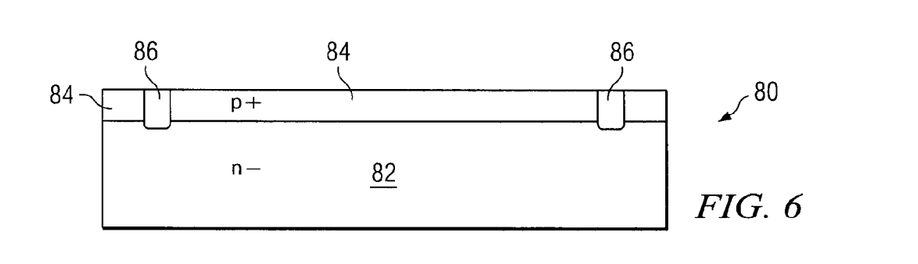
FIG. 6 illustrates a rectifier with a sealed trench junction termination.

A trench rectifier 80 is shown in FIG. 6. Trench rectifier 80 is a high voltage discrete semiconductor device. A p+ layer 84 is formed over n− substrate 82. The p-n junction is defined by n− substrate 82 and p+ layer 84, i.e., at the boundary where n-type semiconductor dopant charge is equal to and opposite of the p-type semiconductor dopant charge. Substrate 82 and layer 84 can be formed with respectively opposite conductivity types.

A trench 86 is formed through p+ layer 84 and extends into n− substrate 82 using a photolithographic and anisotropic etching process. A photoresist layer is deposited to establish an area for trench 86. In plan view, trench 86 is circular, oval, rounded, rectangular, hexagon, or other polygonal shape to surround the p-n junction. The unmasked areas are subjected to the anisotropic etch to form trench 86 to a predetermined depth. Trench 86 is made at least as deep as or deeper than the physical p-n junction between n− substrate 82 and p+ layer 84 to provide a high voltage termination of the junction. The sidewalls of trench 86 are substantially vertical. Alternatively, trench 86 can be formed by laser drilling or isotropic etching.

In one embodiment, trench 86 can be lined or coated with a thermal oxide layer, such as SiO2, in an oxygen atmosphere at a temperature between 800° C. to 1150° C. The lining or coating seals the perimeter of the p-n junction from contamination and provides long-term stability of diode 80. Trench 86 is then filled with a dielectric or electrical insulating material, such as Si3N4, SiON, SiO2, Ta2O5, ZrO2, Al2O3, polysilicon, amorphous silicon, and semi-insulating polysilicon. The insulation-filled trench is planarized using etch-back or CMP to be even with the surface of p+ layer 84 in order to form metallization layers which make ohmic electrical contact with the opposing regions of diode 80.

The vertical insulation-filled trench defines the horizontal boundary of the p-n junction as a vertical plane extending at least down to or past the physical p-n junction. Any electric field imposed by a high voltage terminates at the horizontal boundary established by electrical insulating trench 86. Accordingly, trench 86 functions as a sealed trench junction termination, which provides a high breakdown voltage for the device. The electrical insulating trench 86 uses a small silicon area for the sealed trench junction termination, while providing mechanical strength for the wafer during subsequent handling in the manufacturing process which provides a high breakdown voltage for the device.

Figure 7:
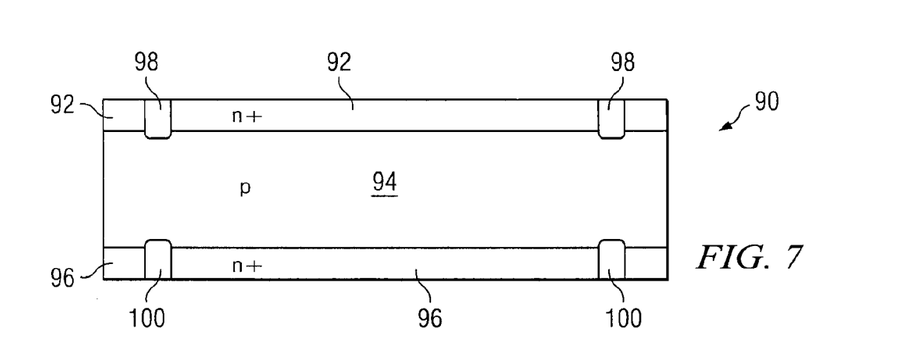
FIG. 7 illustrates a bidirectional transient voltage suppressor with a sealed trench junction termination.

A trench transient voltage suppressor (TVS) 90 is shown in FIG. 7. TVS 90 is a bidirectional discrete semiconductor device. An n+ layer 92 is formed over a first surface of p substrate 94. A first p-n junction is defined by p substrate 94 and n+ layer 92, i.e., at the boundary where n-type semiconductor dopant charge is equal to and opposite of the p-type semiconductor dopant charge. An n+ layer 96 is formed over a second surface of p substrate 94. The n+ layer 96 is the same as n+ layer 92 but formed on the backside of p substrate 92. A second p-n junction is defined by p substrate 94 and n+ layer 96, i.e., at the boundary where n-type semiconductor dopant charge is equal to and opposite of the p-type semiconductor dopant charge. Substrate 94 and layers 92 and 96 can be formed with respectively opposite conductivity types.

A trench 98 is formed through n+ layer 92 and extends into p substrate 94 using a photolithographic and anisotropic etching process. Likewise, trench 100 is formed on the backside of the wafer through n+ layer 96 and extends into p substrate 94 using the same photolithographic and anisotropic etching process. A photoresist layer is deposited to establish areas for trenches 98 and 100. In plan view, trenches 98 and 100 are circular, oval, rounded, rectangular, hexagon, or other polygonal shape to surround the respective p-n junctions. The unmasked areas are subjected to the anisotropic etch to form trenches 98 and 100 to a predetermined depth. Trench 98 is made at least as deep as or deeper than the physical p-n junction between n+ layer 92 and p substrate 94 to provide a high voltage termination of the junction. Trench 100 is made at least as deep as or deeper than the physical p-n junction between n+ layer 96 and p substrate 94 to provide a high voltage termination of the junction. The sidewalls of trenches 98 and 100 are substantially vertical. Alternatively, trenches 98 and 100 can be formed by laser drilling or isotropic etching.

Trenches 98 and 100 are each lined or coated with a thermal oxide layer, such as SiO2, in an oxygen atmosphere at a temperature between 800° C. to 1150° C. The lining or coating seals the perimeter of the p-n junction from contamination and provides long-term stability of TVS 90. Trenches 98 and 100 are each filled with a dielectric or electrical insulating material, such as Si3N4, SiON, SiO2, Ta2O5, ZrO2, Al2O3, polysilicon, amorphous silicon, and semi-insulating polysilicon. The insulation-filled trench is planarized using etch-back or CMP to be even with the surface of n+ layer 92 and n+ layer 96 in order to form metallization layers which makes ohmic electrical contact with the opposing regions of TVS 90.

The vertical insulation-filled trench defines the horizontal boundary of the p-n junction as a vertical plane extending at least down to or past the physical p-n junction. Any electric field imposed by a high voltage terminates at the horizontal boundary established by electrical insulating trenches 98 and 100. Accordingly, trenches 98-100 function as a sealed trench junction termination, which provides a high breakdown voltage for the device. The electrical insulating trenches 98-100 use a small silicon area for the sealed trench junction termination, while providing mechanical strength for the wafer during subsequent handling in the manufacturing process.

Figure 8:
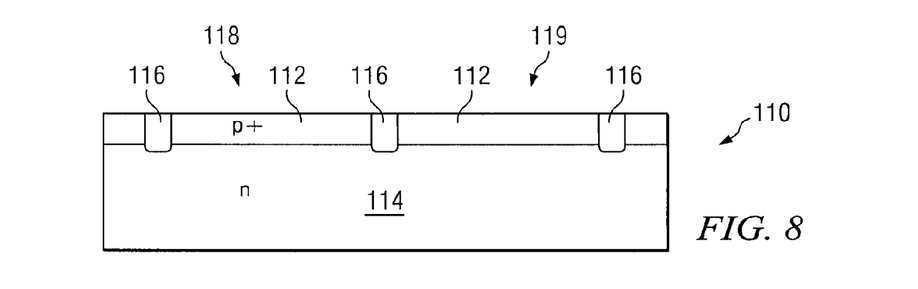
FIG. 8 illustrates a transient voltage suppressor with a sealed trench junction termination.

A trench TVS 110 is shown in FIG. 8. TVS 110 is a lateral discrete semiconductor device. A p+ layer 112 is formed over n substrate 114. The p+ layer 112 and n substrate 114 can be formed with respectively opposite conductivity types. A trench 116 is formed through p+ layer 112 and extends into n substrate 114 using a photolithographic and anisotropic etching process. In plan view, trench 116 is circular, oval, rounded, rectangular, hexagon, or other polygonal shape which surrounds separate p-n junctions. A first p-n junction is defined by n substrate 114 and p+ layer 112 in area 118. A second p-n junction is defined by n substrate 114 and p+ layer 112 in area 119. Trench 116 is made at least as deep as or deeper than the physical p-n junction between p+ layer 112 and n substrate 114 to provide a high voltage termination of the junction. The sidewalls of trench 116 are substantially vertical. Alternatively, trench 116 can be formed by laser drilling or isotropic etching.

In one embodiment, trench 116 can be lined or coated with a thermal oxide layer, such as SiO2, in an oxygen atmosphere at a temperature between 800° C. to 1150° C. The lining or coating seals the perimeter of the p-n junction from contamination and provides long-term stability of TVS 110. Trench 116 is filled with a dielectric or electrical insulating material, such as Si3N4, SiON, SiO2, Ta2O5, ZrO2, Al2O3, polysilicon, amorphous silicon, and semi-insulating polysilicon. The insulation-filled trench is planarized using etch-back or CMP to be even with the surface of p+ layer 112 in order to form metallization layers which makes ohmic electrical contact with the opposing regions of TVS 110.

The vertical insulation-filled trench defines the horizontal boundary of the p-n junctions as a vertical plane extending at least down to or past the physical p-n junction. Any electric field imposed by a high voltage terminates at the horizontal boundary established by electrical insulating trench 116. Accordingly, trench 116 functions as a sealed trench junction termination, which provides a high breakdown voltage for the device. The electrical insulating trench 116 uses a small silicon area for the sealed trench junction termination, while providing mechanical strength for the wafer during subsequent handling in the manufacturing process.

Figure 9:
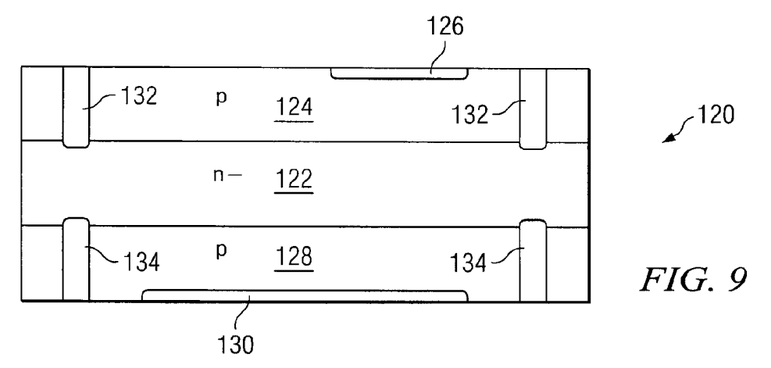
FIG. 9 illustrates a thyristor with a sealed trench junction termination.

FIG. 9 illustrates a cross-sectional view of trench thyristor or SCR 120 formed monolithically on n– substrate 122. Substrate 122 provides structural support for the device. A p layer 124 is formed on a first surface of n– substrate 122. An n+ region 126 is formed in p layer 124. A p layer 128 is formed on a second surface of n– substrate 122. The p layers 124 and 128 can be formed by diffusing p-type dopant into both sides of substrate 122. A p+ region 130 is formed in p layer 128 for electrical contact. Thyristor 120 is a solid state semiconductor device with four layers of alternating n-type and p-type semiconductor material, i.e., n-p-n-p defined by n+ region 126, p layer 124, n– substrate 122, and p layer 128. The thyristor operates as a switch, conducting when the gate receives a current pulse, and continuing to conduct while forward biased. Substrate 122, layers 124, 128 and 130, and region 126 can be formed with respectively opposite conductivity types.

A trench 132 is formed through p layer 124 and extends into n– substrate 122 using a photolithographic and anisotropic etching process. A photoresist layer is deposited to establish an area that surrounds the p-n junction of p layer 124 and n– substrate 122. Likewise, a trench 134 is formed through p layer 128 and extends into n– substrate 122 using the same photolithographic and anisotropic etching process. A photoresist layer is deposited to establish an area that surrounds the p-n junction of p layer 128 and n– substrate 122. In plan view, trenches 132 and 134 are circular, oval, rounded, rectangular, hexagon, or other polygonal shape to surround the respective p-n junctions. The unmasked areas are subjected to the anisotropic etch to form trenches 132 and 134 to a predetermined depth. Trench 132 is made at least as deep as or deeper than the physical p-n junction between p layer 124 and n– substrate 122 to provide a high voltage termination of the junction. Trench 134 is made at least as deep as or deeper than the physical p-n junction between p layer 128 and n– substrate 122 to provide a high voltage termination of the junction. The sidewalls of trenches 132 and 134 are substantially vertical. Alternatively, trenches 132 and 134 can be formed by laser drilling or isotropic etching.

Trenches 132 and 134 can be lined or coated with a thermal oxide layer, such as SiO2, in an oxygen atmosphere at a temperature between 800° C. to 1150° C. The lining or coating seals the perimeter of the p-n junction from contamination and provides long-term stability for TVS 120. Trenches 132 and 134 are filled with a dielectric or electrical insulating material, such as Si3N4, SiON, SiO2, Ta2O5, ZrO2, Al2O3, polysilicon, amorphous silicon, and semi-insulating polysilicon. The insulation-filled trenches are planarized using etch-back or CMP to be even with the surfaces of p layer 124 and 128 in order to form metallization layers which make ohmic electrical contact with the opposing regions of TVS 120.

The vertical insulation-filled trenches define the horizontal boundary of the p-n junction as a vertical plane extending at least down to or past the physical p-n junction. Any electric field imposed by a high voltage terminates at the horizontal boundary established by electrical insulating trenches 132 and 134. Accordingly, trenches 132-134 function as a sealed trench junction termination, which provides a high breakdown voltage for the device. The electrical insulating trenches 132-134 use a small silicon area for the sealed trench junction termination, while providing mechanical strength for the wafer during subsequent handling in the manufacturing process.

By eliminating the p-n junction termination at the surface of the semiconductor body, as well as the junction curvature, TVS 120 has significantly improved electrical characteristics. For example, surface effects on the leakage current of the p-n junction are substantially reduced. The reverse breakdown voltage is higher without increasing the size of the die and complexity of the manufacturing steps. Further, the reverse breakdown voltage of the p-n junction is more consistent across the wafer. The sidewall capacitance of the p– n junction is reduced which increases the frequency response of the device for high frequency applications. A semiconductor device having the electrical insulating trench offers improved reliability, wafer strength, die density per wafer, breakdown voltage, high temperature stability, less risk of breakage or contamination, and overall manufacturing yield.

Figure 10:
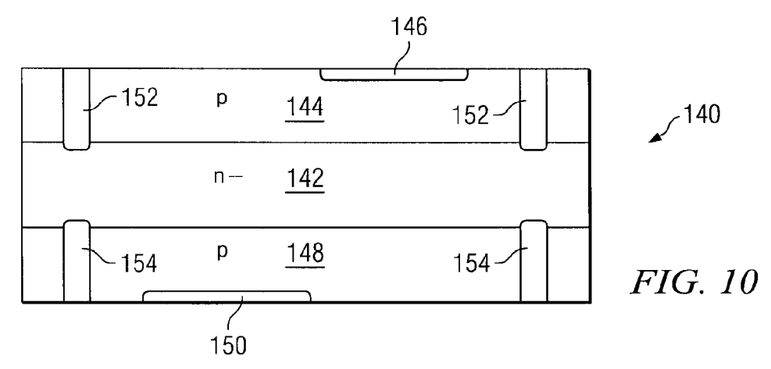
FIG. 10 illustrates a triac with a sealed trench junction termination.

Another discrete semiconductor device is shown in FIG. 10, in this case a trench triode for alternating current (triac). The triac is a bidirectional triode thyristor which conducts current in either direction when activated by either a positive or negative voltage pulse applied to its gate electrode. Once activated, the device continues to conduct until the current through it drops below a threshold value. Triac 140 is formed monolithically on n− substrate 142. Substrate 142 provides structural support for the device. A p layer 144 is formed on a first surface of n− substrate 142. An n+ region 146 is formed in p layer 144. A p layer 148 is formed on a second surface of n− substrate 142. The p layers 144 and 148 can be formed by diffusing p-type dopant into both sides of substrate 142. A n+ region 150 is formed in p layer 148. The triac is a bi-directional device defined by n+ region 146, p layer 144, n− substrate 142, and p layer 148, and by p layer 144, n− substrate 142, p layer 148, and n+ region 150. Substrate 142, layers 144 and 148, and regions 146 and 150 can be formed with respectively opposite conductivity types.

A trench 152 is formed through p layer 144 and extends into n− substrate 142 using a photolithographic and anisotropic etching process. A photoresist layer is deposited to establish an area that surrounds the p-n junction of p layer 144 and n− substrate 142. Likewise, a trench 154 is formed through p layer 148 and extends into n− substrate 142 using the same photolithographic and anisotropic etching process. A photoresist layer is deposited to establish an area that surrounds the p-n junction of p layer 148 and n− substrate 142. In plan view, trenches 152 and 154 are circular, oval, rounded, rectangular, hexagon, or other polygonal shape to surround the respective p-n junctions. The unmasked areas are subjected to the anisotropic etch to form trenches 152 and 154 to a predetermined depth. Trench 152 is made at least as deep as or deeper than the physical p-n junction between p layer 144 and n− substrate 142 to provide a high voltage termination of the junction. Trench 154 is made at least as deep as or deeper than the physical p-n junction between p layer 148 and n− substrate 142 to provide a high voltage termination of the junction. The sidewalls of trenches 152 and 154 are substantially vertical. Alternatively, trenches 152 and 154 can be formed by laser drilling or isotropic etching.

Trenches 152 and 154 can be lined or coated with a thermal oxide layer, such as SiO2, in an oxygen atmosphere at a temperature between 800° C. to 1150° C. The lining or coating seals the perimeter of the p-n junction from contamination and provides long-term stability for triac 140. Trenches 152 and 154 are filled with a dielectric or electrical insulating material, such as Si3N4, SiON, SiO2, Ta2O5, ZrO2, Al2O3, polysilicon, amorphous silicon, and semi-insulating polysilicon. The insulation-filled trenches are planarized using etchback or CMP to be even with the surfaces of p layer 144 and 148 in order to form metallization layers which make ohmic electrical contact with the opposing regions of triac 140.

The vertical insulation-filled trenches define the horizontal boundary of the p-n junction as a vertical plane extending at least down to or past the physical p-n junction. Any electric field imposed by a high voltage terminates at the horizontal boundary established by electrical insulating trenches 152 and 154. Accordingly, trenches 152-154 function as a sealed trench junction termination, which provides a high breakdown voltage for the device. The electrical insulating trenches 152-154 use a small silicon area for the sealed trench junction termination, while providing mechanical strength for the wafer during subsequent handling in the manufacturing process.

By eliminating the p-n junction termination at the surface of the semiconductor body, as well as the junction curvature, triac 140 has significantly improved electrical characteristics. For example, surface effects on the leakage current of the p-n junction are substantially reduced. The reverse breakdown voltage is higher without increasing the size of the die and complexity of the manufacturing steps. Further, the reverse breakdown voltage of the p-n junction is more consistent across the wafer. The sidewall capacitance of the p− n junction is reduced which increases the frequency response of the device for high frequency applications. A semiconductor device having the electrical insulating trench offers improved reliability, wafer strength, die density per wafer, breakdown voltage, high temperature stability, less risk of breakage or contamination, and overall manufacturing yield.

Figure 11:
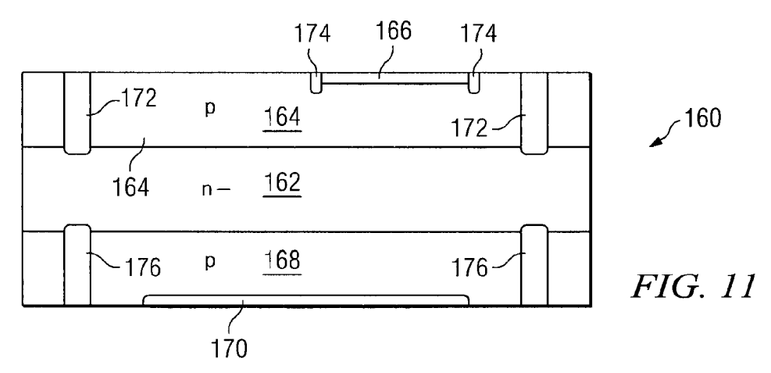
FIG. 11 illustrates a thyristor with multiple sealed trench junction terminations.

FIG. 11 illustrates a cross-sectional view of trench thyristor or SCR 160 formed monolithically on n− substrate 162. Thyristor 160 has multiple sealed trench junction terminations. Substrate 162 provides structural support for the device. A p layer 164 is formed on a first surface of n− substrate 162. An n+ region 166 is formed in p layer 164. A p layer 168 is formed on a second surface of n− substrate 162. The p layers 164 and 168 can be formed by diffusing p-type dopant into both sides of substrate 162. A p+ region 170 is formed in p layer 168 for electrical contact. Thyristor 160 is a solid state semiconductor device with four layers of alternating n-type and p-type semiconductor material, i.e., n-p-n-p defined by n+ region 166, p layer 164, n− substrate 162, and p layer 168. The thyristor operates as a switch, conducting when the gate receives a current pulse, and continuing to conduct while forward biased. Substrate 162, layers 164 and 168, and regions 166 and 170 can be formed with respectively opposite conductivity types.

A trench 172 is formed through p layer 164 and extends into n− substrate 162 using a photolithographic and anisotropic etching process. A photoresist layer is deposited to establish an area that surrounds the p-n junction of p layer 164 and n− substrate 162. Likewise, a trench 174 is formed in p layer 164 around n+ region 166. The photoresist layer also establishes an area that surrounds n+ region 166. In a similar manner, a trench 176 is formed through p layer 168 and extends into n− substrate 162 using the same photolithographic and anisotropic etching process. A photoresist layer is deposited to establish an area that surrounds the p-n junction of p layer 168 and n− substrate 162. In plan view, trenches 172-176 are circular, oval, rounded, rectangular, hexagon, or other polygonal shape to surround the respective p-n junctions. The unmasked areas are subjected to the anisotropic etch to form trenches 172-176 to a predetermined depth. Trench 172 is made at least as deep as or deeper than the physical p-n junction between p layer 164 and n− substrate 162 to provide a high voltage termination of the junction. Trench 174 is made at least as deep as or deeper than the physical p-n junction between p layer 164 and n+ region 166 to provide a high voltage termination of the junction. Trench 176 is made at least as deep as or deeper than the physical p-n junction between p layer 168 and n− substrate 162 to provide a high voltage termination of the junction. The sidewalls of trenches 172-176 are substantially vertical. Alternatively, trenches 172-176 can be formed by laser drilling or isotropic etching.

In one embodiment, trenches 172-176 can be lined or coated with a thermal oxide layer, such as SiO2, in an oxygen atmosphere at a temperature between 800° C. to 1150° C. The lining or coating seals the perimeter of the p-n junction from contamination and provides long-term stability for thyristor 160. Trenches 172-176 are filled with a dielectric or electrical insulating material, such as Si3N4, SiON, SiO2, Ta2O5, ZrO2, Al2O3, polysilicon, amorphous silicon, and semi-insulating polysilicon. The insulation-filled trenches are planarized using etch-back or CMP to be even with the surfaces of p layer 164 and 168 in order to form metallization layers which make ohmic electrical contact with the opposing regions of thyristor 160.

The vertical insulation-filled trenches define the horizontal boundary of the p-n junction as a vertical plane extending at least down to or past the physical p-n junction. Any electric field imposed by a high voltage terminates at the horizontal boundary established by electrical insulating trenches 172-176. Accordingly, trenches 172-176 function as multiple sealed trench junction terminations, which provide a high breakdown voltage for the device. The electrical insulating trenches 172-176 use a small silicon area for the sealed trench junction termination, while providing mechanical strength for the wafer during subsequent handling in the manufacturing process.

Figure 12:
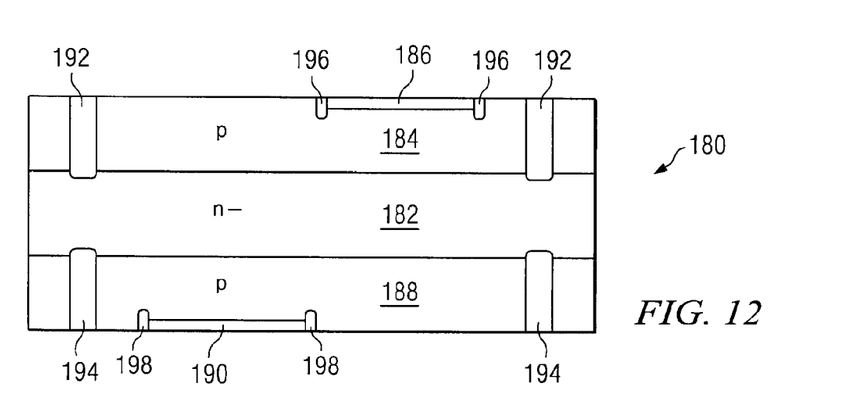
FIG. 12 illustrates a triac with multiple sealed trench junction terminations.

Another discrete semiconductor device is shown in FIG. 12, in this case a trench triac. The triac is a bidirectional triode thyristor which conducts current in either direction when activated by either a positive or negative voltage pulse applied to its gate electrode. Once activated, the device continues to conduct until the current through it drops below a threshold value. Triac 180 is formed monolithically on n– substrate 182. Triac 180 has multiple sealed trench junction terminations. Substrate 182 provides structural support for the device. A p layer 184 is formed on a first surface of n– substrate 182. An n+ region 186 is formed in p layer 184. A p layer 188 is formed on a second surface of n– substrate 182. The p layers 184 and 188 can be formed by diffusing p-type dopant into both sides of substrate 182. A n+ region 190 is formed in p layer 188. The triac is a bi-directional device defined by n+ region 186, p layer 184, n– substrate 182, and p layer 188, and by p layer 184, n– substrate 182, p layer 188, and n+ region 190. Substrate 182, layers 184 and 188, and regions 186 and 190 can be formed with respectively opposite conductivity types.

A trench 192 is formed through p layer 184 and extends into n– substrate 182 using a photolithographic and anisotropic etching process. A photoresist layer is deposited to establish an area that surrounds the p-n junction of p layer 184 and n– substrate 182. Likewise, a trench 196 is formed in p layer 184 around n+ region 186. The photoresist layer also establishes an area that surrounds n+ region 186. In a similar manner, a trench 194 is formed through p layer 188 and extends into n– substrate 182 using the same photolithographic and anisotropic etching process. A photoresist layer is deposited to establish an area that surrounds the p-n junction of p layer 188 and n– substrate 182. A trench 198 is formed in p layer 188 around n+ region 190. The photoresist layer also establishes an area that surrounds n+ region 190. In plan view, trenches 192-198 are circular, oval, rounded, rectangular, hexagon, or other polygonal shape to surround the respective p-n junctions. The unmasked areas are subjected to the anisotropic etch to form trenches 192-198 to a predetermined depth. Trench 192 is made at least as deep as or deeper than the physical p-n junction between p layer 184 and n– substrate 182 to provide a high voltage termination of the junction. Trench 194 is made at least as deep as or deeper than n+ region 186 again to provide a high voltage termination. Trench 196 is made at least as deep as or deeper than the physical p-n junction between p layer 188 and n– substrate 182. Trench 198 is made at least as deep as or deeper than n+ region 190 again to provide a high voltage termination. The sidewalls of trenches 192-198 are substantially vertical. Alternatively, trenches 192-198 can be formed by laser drilling or isotropic etching.

Trenches 192-198 can be lined or coated with a thermal oxide layer, such as SiO2, in an oxygen atmosphere at a temperature between 800° C. to 1150° C. The lining or coating seals the perimeter of the p-n junction from contamination and provides long-term stability for triac 180. Trenches 192-198 are filled with a dielectric or electrical insulating material, such as Si3N4, SiON, SiO2, Ta2O5, ZrO2, Al2O3, polysilicon, amorphous silicon, and semi-insulating polysilicon. The insulation-filled trenches are planarized using etch-back or CMP to be even with the surfaces of p layer 184 and 188 in order to form metallization layers which make ohmic electrical contact with the opposing regions of triac 180.

The vertical insulation-filled trenches define the horizontal boundary of the p-n junction as a vertical plane extending at least down to or past the physical p-n junction. Any electric field imposed by a high voltage terminates at the horizontal boundary established by electrical insulating trenches 192-198. Accordingly, trenches 192-198 function as multiple sealed trench junction terminations, which provide a high breakdown voltage for the device. The electrical insulating trenches 192-198 use a small silicon area for the sealed trench junction termination, while providing mechanical strength for the wafer during subsequent handling in the manufacturing process.

Figure 13A:
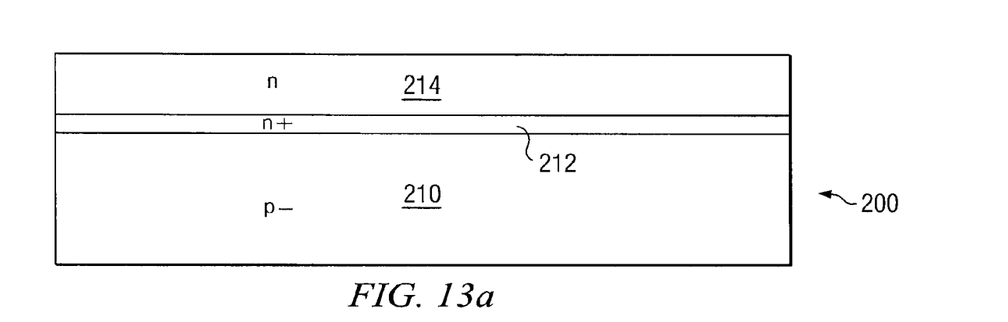
FIGS. 13a-13e illustrate a process of forming an IC including a bipolar transistor with a sealed trench junction termination.

FIGS. 13a-13e illustrate a manufacturing process flow for an IC 200. While the process flow is directed to a bipolar transistor, a similar process can be used to form diodes, passive devices, and other IC semiconductor devices. In FIG. 13a, a p– substrate 210 is silicon, gallium arsenide, or other bulk semiconductor material for structural support. The p-type semiconductor dopant can be boron, aluminum, or gallium. The p– substrate 210 has a resistivity between 1 to 50 ohms-cm. Using a sheet-type doping process, the surface of substrate 210 is implanted with n-type dopant, typically phosphorus, arsenic, or antimony, to a surface concentration of 1E19 atoms/cm$^3$ to form n+ buried layer 212. An n epi layer 214 is formed on n+ buried layer 212. The n+ buried layer 212 provides electrical isolation of the IC and reduces pattern washout effects that may occur on Si <111> and Si <100> crystal orientation substrates during formation of n epi layer 214.

Figure 13B:
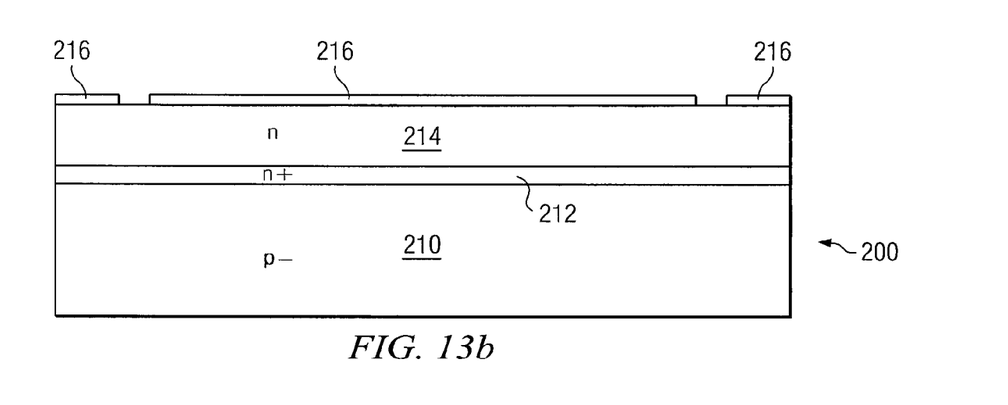
Figure 13C:
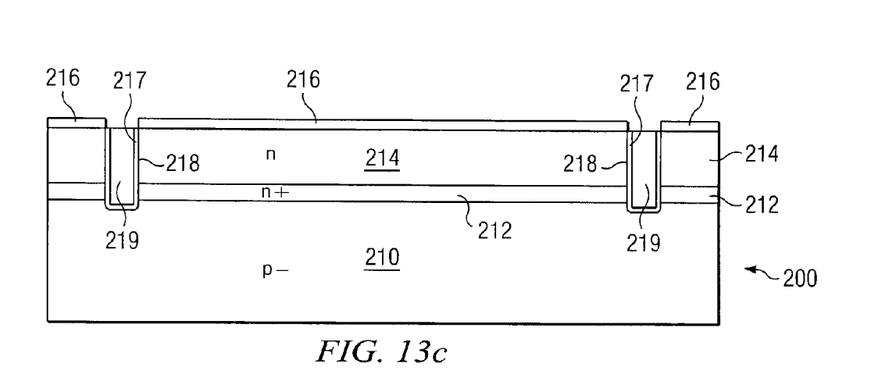

In FIG. 13b, an oxide layer 216 is formed over n epi layer 214. Using a photolithographic and anisotropic etching process, a portion of oxide layer 216 is removed by an etching process to form a trench. In FIG. 13c, trench 218 is formed through the opening in oxide layer 216. Trench 218 extends through n epi layer 214 and n+ buried layer 212 and extends into p– substrate 210. In plan view, trench 218 is circular, oval, rounded, rectangular, hexagon, or other polygonal shape to surround the p-n junction. The sidewalls of trench 218 are substantially vertical and at least as deep as or deeper than the physical p-n junction between p– substrate 210 and n+ buried layer 212 to provide a high voltage termination of the junction. Alternatively, trench 218 can be formed by laser drilling or isotropic etching.

Trench 218 is lined or coated with a thermal oxide layer 217, such as SiO2, in an oxygen atmosphere at a temperature between 800° C. to 1150° C. The lining or coating 217 seals the perimeter of the p-n junction from contamination and provides long-term stability for IC 200. Trench 218 is filled with a dielectric or electrical insulating material 219, such as Si3N4, SiON, SiO2, Ta2O5, ZrO2, Al2O3, polysilicon, amorphous silicon, and semi-insulating polysilicon. The insulation-filled trench is planarized using etch-back or CMP to be even with the surface of n epi layer 214 in order to form metallization layers which make ohmic electrical contact with the opposing regions of IC 200.

Figure 13D:
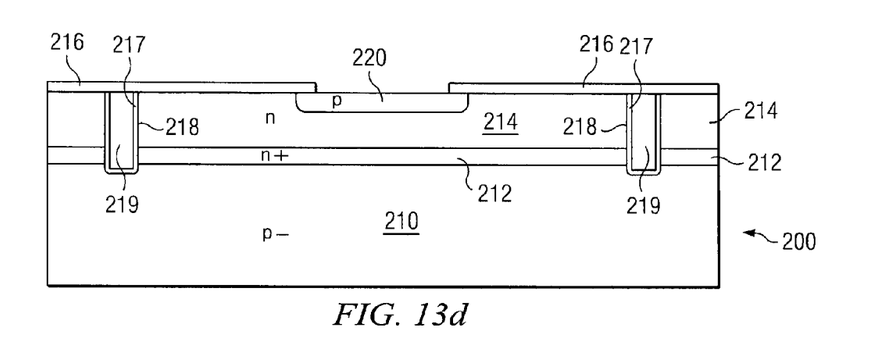
Figure 13E:
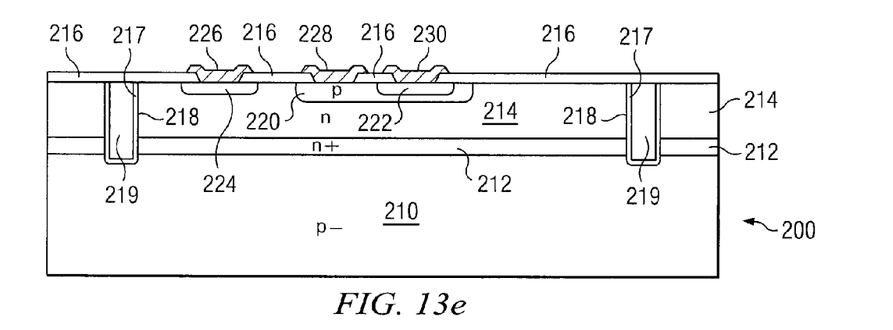

FIG. 13d shows p base well 220 formed in n epi layer 214. In FIG. 13e, an n+ region 222 is formed in p base well 220. The n+ region 222 operates as an emitter of the transistor. An n+ region 224 is formed in n epi layer 214 for electrical contact. The oxide layer 216 is patterned for metal contacts 226, 228, and 230 to n+ region 224, p base well 220, and n+ region 222, which form the emitter, base, and collector of the n-p-n transistor, respectively.

The vertical insulation-filled trench defines the horizontal boundary of the p-n junction as a vertical plane extending at least down to or past the physical p-n junction. Any electric field imposed by a high voltage terminates at the horizontal boundary established by electrical insulating trench 217-219. Accordingly, trench 217-219 functions as a sealed trench junction termination, which provides a high breakdown voltage for the device. The electrical insulating trench 217-219 uses a small silicon area for the sealed trench junction termination, while providing mechanical strength for the wafer during subsequent handling in the manufacturing process.

By eliminating the p-n junction termination at the surface of the semiconductor body, as well as the junction curvature, IC 200 has significantly improved electrical characteristics. For example, surface effects on the leakage current of the p-n junction are substantially reduced. The reverse breakdown voltage is higher without increasing the size of the die and complexity of the manufacturing steps. Further, the reverse breakdown voltage of the p-n junction is more consistent across the wafer. The sidewall capacitance of the p- n junction is reduced which increases the frequency response of the device for high frequency applications. A semiconductor device having the electrical insulating trench offers improved reliability, wafer strength, die density per wafer, breakdown voltage, high temperature stability, less risk of breakage or contamination, and overall manufacturing yield.

Figure 14:
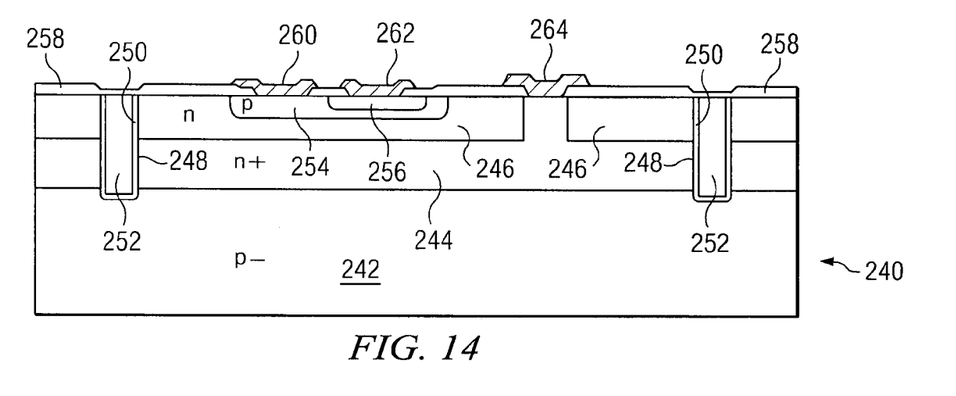
FIG. 14 is an alternate embodiment of the bipolar transistor with a sealed trench junction termination.

FIG. 14 shows an alternate embodiment of the n-p-n bipolar transistor in IC 240. The surface of p- substrate 242 is implanted with n-type dopant to a surface concentration of $1E19$ atoms/cm$^3$ to form n+ buried layer 244. The n+ buried layer extends to the surface of n epi layer 246. An n epi layer 246 is formed on n+ buried layer 244. The n+ buried layer extends to the surface of IC 240 even with n epi layer 246. A trench 248 is formed using a photolithographic and anisotropic etching process. Trench 248 extends through n epi layer 246 and n+ buried layer 244 and into p- substrate 242. In plan view, trench 248 is circular, oval, rounded, rectangular, hexagon, or other polygonal shape to surround the p-n junction. The sidewalls of trench 248 are substantially vertical and at least as deep as or deeper than the physical p-n junction between p- substrate 242 and n+ buried layer 244 to provide a high voltage termination of the junction. Alternatively, trench 248 can be formed by laser drilling or isotropic etching.

Trench 248 is lined or coated with a thermal oxide layer 250, such as SiO2, in an oxygen atmosphere at a temperature between 800° C. to 1150° C. The lining or coating 250 seals the perimeter of the p-n junction from contamination and provides long-term stability for IC 240. Trench 248 is filled with a dielectric or electrical insulating material 252, such as Si3N4, SiON, SiO2, Ta2O5, ZrO2, Al2O3, polysilicon, amorphous silicon, and semi-insulating polysilicon. The insulation-filled trench is planarized using etch-back or CMP to be even with the surface of n epi layer 246 in order to form metallization layers which make ohmic electrical contact with the opposing regions of IC 240.

A p base well 254 formed in n epi layer 246. An n+ region 256 is formed in p base well 254. The n+ region 256 operates as an emitter of the transistor. The oxide layer 258 is patterned for metal contacts 260, 262, and 264 to p base well 254, n+ region 256, and n+ buried layer 244, which form the base, emitter, and collector of the n-p-n transistor, respectively.

The vertical insulation-filled trench defines the horizontal boundary of the p-n junction as a vertical plane extending at least down to or past the physical p-n junction. Any electric field imposed by a high voltage terminates at the horizontal boundary established by electrical insulating trench 248-252. Accordingly, trench 248-252 functions as a sealed trench junction termination, which provides a high breakdown voltage for the device. The electrical insulating trench 248-252 uses a small silicon area for the sealed trench junction termination, while providing mechanical strength for the wafer during subsequent handling in the manufacturing process.

Figure 15:
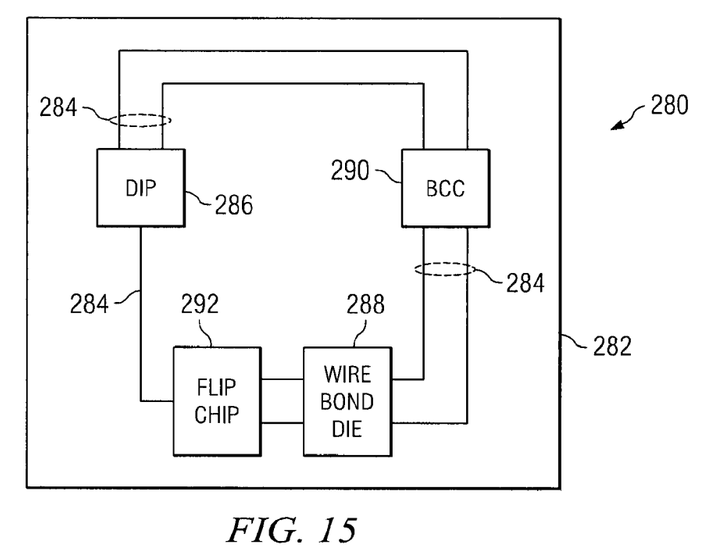
FIG. 15 illustrates a PCB with different types of semiconductor packages mounted to its surface.

FIG. 15 illustrates electronic device 280 having a chip carrier substrate or printed circuit board (PCB) 282 with a plurality of semiconductor packages or semiconductor die mounted on its surface. Electronic device 280 may have one type of semiconductor package, or multiple types of semiconductor packages, depending on the application. The different types of semiconductor packages are shown in FIG. 15 for purposes of illustration.

Electronic device 280 may be a stand-alone system that uses the semiconductor packages to perform an electrical function. Alternatively, electronic device 280 may be a subcomponent of a larger system. For example, electronic device 280 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

PCB 282 provides a general substrate for structural support and electrical interconnect of the semiconductor packages and other electronic components mounted on the PCB. Conductive signal traces 284 are formed on a surface or within layers of PCB 282 using evaporation, electrolytic plating, electroless plating, screen printing, or other suitable metal deposition process. Signal traces 284 provide for electrical communication between each of the semiconductor packages, mounted components, and any connected external system components. Traces 284 also provide power and ground connections to each of the semiconductor packages.

For the purpose of illustration, several types of semiconductor packages, including a dual in-line package (DIP) 286, wire-bonded die 288, bump chip carrier (BCC) 290, and flip chip package 292, are shown mounted on PCB 282. Depending upon the system requirements, any combination of semiconductor packages or other electronic components can be connected to PCB 282. In some embodiments, electronic device 280 includes a single attached semiconductor package, while other embodiments call for multiple interconnected packages. By combining one or more semiconductor packages over a single substrate, manufacturers can incorporate pre-made components into electronic devices and systems.

Each of the semiconductor packages contains a discrete semiconductor device or IC with the sealed trench junction termination described above. These semiconductor devices exhibit improved reliability, wafer strength, die density per wafer, breakdown voltage, high temperature stability, less risk of breakage or contamination, and overall manufacturing yield.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
providing a substrate including semiconductor material of a first conductivity type;
forming a buried semiconductor layer of a second conductivity type in the substrate;
forming a first semiconductor layer of the second conductivity type over the buried semiconductor layer;
forming a trench through the first semiconductor layer and through the buried semiconductor layer;
forming a first insulating layer on a wall of the trench;
depositing an insulating material in the trench;
forming a discrete device by,
(a) doping the first semiconductor layer to form a second semiconductor layer of the first conductivity type, and
(b) forming a third semiconductor layer of the second conductivity type in the second semiconductor layer;
forming a second insulating layer in contact with the first semiconductor layer, second semiconductor layer, third semiconductor layer, first insulating layer, and insulating material;
forming a first metal layer directly above and abutting the second semiconductor layer; and
forming a second metal layer directly above and abutting the third semiconductor layer, wherein the insulating material in the trench surrounds the discrete device.

2. The method of claim 1, further including planarizing the insulating material.

3. The method of claim 1, wherein the first semiconductor layer includes a first and second section separated by the buried semiconductor layer.

4. The method of claim 1, further including forming the trench in a rounded or polygonal shape.

5. The method of claim 1, further including:
forming a fourth semiconductor layer of the second conductivity type in the first semiconductor layer; and
forming a third metal layer directly above and abutting the fourth semiconductor layer.

6. A method of making a semiconductor device, comprising:
providing a substrate including semiconductor material of a first conductivity type;
forming a buried semiconductor layer of a second conductivity type in the substrate;
forming a first semiconductor layer of the second conductivity type over the buried semiconductor layer;
forming a trench through the first semiconductor layer and buried semiconductor layer and extending below the buried semiconductor layer;
depositing an insulating material in the trench;
forming a second semiconductor layer of the first conductivity type in the first semiconductor layer;
forming a first insulating layer over and in contact with the second semiconductor layer and insulating material; and
forming a first metal layer above and abutting the second semiconductor layer, wherein the insulating material in the trench surrounds the second semiconductor layer.

7. The method of claim 6, further including forming an insulating layer on a wall of the trench.

8. The method of claim 6, further including:
forming a third semiconductor layer of the second conductivity type in the second semiconductor layer; and
forming a second metal layer directly above and abutting the third semiconductor layer.

9. The method of claim 8, further including forming a fourth semiconductor layer of the second conductivity type in the first semiconductor layer.

10. The method of claim 6, further including planarizing the insulating material.

11. The method of claim 6, wherein the first semiconductor layer includes a first and second section separated by the buried semiconductor layer.

12. The method of claim 6, further including forming the trench in rounded or polygonal shape.

13. The method of claim 6, further including depositing the insulating material in the trench with the insulating material extending through the buried semiconductor layer.

* * * * *